United States Patent [19]

Yoshimori

[11] Patent Number: 5,446,402
[45] Date of Patent: Aug. 29, 1995

[54] NOISE TOLERANT CODE SETTING CIRCUIT

[75] Inventor: Masanori Yoshimori, Tokyo, Japan
[73] Assignee: NEC Corporation, Tokyo, Japan
[21] Appl. No.: 298,459
[22] Filed: Aug. 30, 1994
[30] Foreign Application Priority Data
Sep. 1, 1993 [JP] Japan .................... 5-240354
[51] Int. Cl.⁶ .................. H03K 19/0948; H01H 37/76
[52] U.S. Cl. ......................... 326/108; 326/9; 326/30; 327/525; 327/546
[58] Field of Search ................ 326/108, 106, 9, 30, 326/38, 105; 327/525, 545–546, 310, 314; 361/91

[56] References Cited

U.S. PATENT DOCUMENTS

| | | | |
|---|---|---|---|
| 4,686,384 | 8/1987 | Harvey et al. | 327/525 |
| 4,730,129 | 3/1988 | Kunitoki et al. | 327/525 |
| 5,015,889 | 5/1991 | Reay | 327/546 |
| 5,153,458 | 10/1992 | Hinooka | 326/38 |
| 5,173,616 | 12/1992 | Hinooka | 327/525 |

FOREIGN PATENT DOCUMENTS 4150050  5/1992  Japan .

*Primary Examiner*—David R. Hudspeth
*Assistant Examiner*—Jon Santamauro
*Attorney, Agent, or Firm*—Ostrolenk, Faber, Gerb & Soffen

[57] ABSTRACT

In a code setting circuit wherein pad terminals are supplied with a voltage pulse to burn out corresponding thin-film resistors, first transistors of first conductivity type are adapted to be turned on in response to a turn-on pulse and second transistors of the first conductivity type are provided. The channel of each second transistor is connected in parallel with the channel of each first transistor between a voltage source and one of circuit nodes at which desired potentials are developed and a digital setting signal is generated corresponding thereto. Inverters are connected between the nodes and the gate terminals of the second transistors to keep the nodes at the desired potentials. Third transistors of second conductivity type are provided to prevent the voltage source from being coupled through the second transistors to the pad terminals. Blocking means are provided respectively corresponding to the third transistors and the pad terminals. Each blocking means is connected between the other end of the channel of the corresponding third transistor and the corresponding pad terminal for preventing a noise pulse generated when the voltage pulse is applied to the corresponding pad terminal from being applied to the corresponding third transistor.

4 Claims, 3 Drawing Sheets

NOISE TOLERANT CODE SETTING CIRCUIT

BACKGROUND OF THE INVENTION

1. Field Of the Invention

The present invention relates to a code setting circuit for generating a digital signal which is used by an external circuit for setting a reference value or the like.

2. Description of the Related Art

A code setting circuit as disclosed in Japanese Provisional Patent Publication 4-150050 includes a plurality of thin-film resistors which are selectively burned out by the application of a voltage pulse through respective pad terminals to produce a set of high and low potentials. By using these potentials, a decoder generates a digital setting signal. However, when the voltage pulse is applied to a pad terminal, there is a sharp increase in the impedance of the pad terminal and a noise pulse is generated. Due to this noise pulse, a MOS transistor connected to the pad terminal is destroyed, failing to burn out a desired thin-film resistor.

SUMMARY OF THE INVENTION

It is therefore an object of the present invention to provide a code setting circuit that is tolerant of a high noise voltage pulse generated when a voltage pulse is applied to any of the pad terminals.

According to the present invention, there is provided a code setting circuit comprising a plurality of pad terminals to each of which a voltage pulse is applied, and a plurality of thin-film resistors corresponding respectively to the pad terminals. Each of the thin-film resistors is connected between the corresponding pad terminal and a reference potential, or ground. A plurality of first transistors of first conductivity type are adapted to be rendered conductive in response to a turn-on pulse. A plurality of second transistors of the first conductivity type corresponding to the first transistors are provided, each of the second transistors having a channel connected in parallel with a channel of the corresponding first transistor between a voltage source and a corresponding one of a plurality of nodes. A plurality of inverters are provided corresponding respectively to the second transistors and the nodes. Each of the inverters is connected between the corresponding node and the gate terminal of the corresponding second transistor. A plurality of third transistors of second conductivity type opposite to the first conductivity type are provided corresponding respectively to the nodes. Each of the third transistors has a channel connected at one end to the corresponding node and a gate terminal biased so that the third transistor prevents the voltage source from being coupled through a corresponding one of the second transistors to a corresponding one of the pad terminals. A plurality of blocking means are provided respectively corresponding to the third transistors and the pad terminals. Each of the blocking means is connected between the other end of the channel of the corresponding third transistor and the corresponding pad terminal for preventing a noise pulse which is generated when the voltage pulse is applied to the corresponding pad terminal from being applied to the corresponding third transistor. A digital setting signal is generated corresponding to a set of different potentials developed at the nodes.

In a specific aspect, each of the blocking means comprises a diode which is connected so that a current flows in a direction from the corresponding third transistor to the corresponding pad terminal, or a resistor.

BRIEF DESCRIPTION OF THE DRAWINGS

The present invention will be described in further detail with reference to the accompanying drawings, in which.

DETAILED DESCRIPTION

Figure 1:
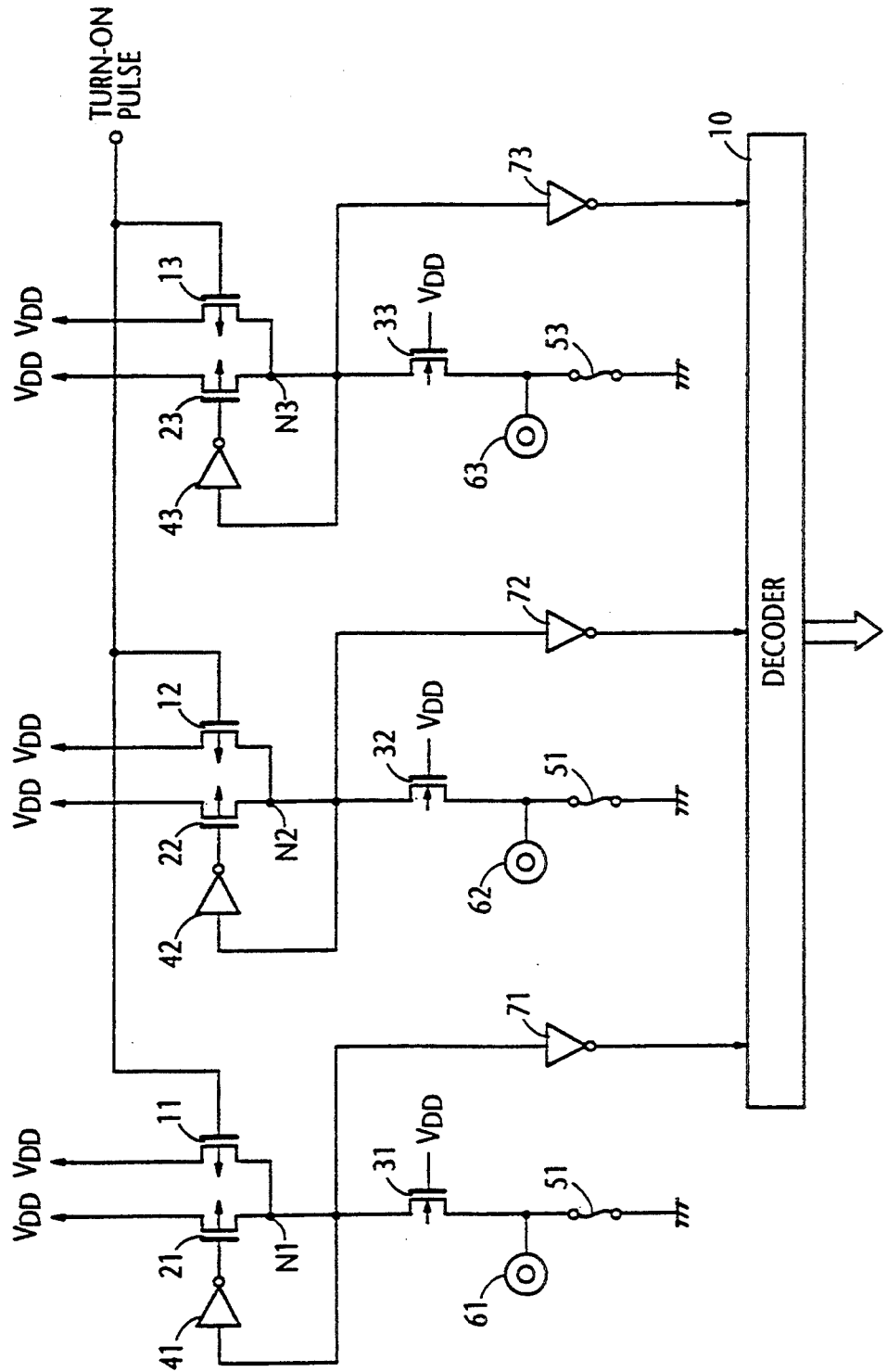
FIG. 1 is a block diagram of a prior art code setting circuit.

Prior to the description of the present invention, reference is first made to FIG. 1 to describe the code setting circuit disclosed in Japanese Provisional Patent Publication 4-150050. The known code setting circuit includes a plurality of pairs of field effect transistors as represented by P-channel MOS transistors 11, 21, 12, 22 and 13 and 23. The drain terminals of the transistors of each pair are connected together to a corresponding one of nodes N1, N2, N3 and their source terminals are connected to voltage source VDD. The gate terminals of transistors 11, 12 and 13 are connected together to receive a negative turn-on pulse from an external circuit. Nodes N1, N2 and N3 are respectively connected via inverters 41, 42 and 43 to the gate terminals of transistors 21, 22, 23, and via inverters 71, 72, 73 to respective inputs of a decoder 10 where they are translated into a corresponding digital value which will be used for setting a reference voltage or the like of an external circuit. Nodes N1, N2 and N3 are further connected via the drain-to-source paths of N-channel MOS transistors 31, 32, 33 to thin-film resistors 51, 52, 53, respectively, to ground, or reference potential. Each of the transistors 11, 12, 13 has a turn-on resistance of more than 1000 ohms and each of the thin-film resistors has a resistance of 50 ohms. In response to the negative turn-on pulse, transistors 11, 12, 13 are briefly turned on, causing the corresponding nodes N1, N2, N3 to be driven to a low voltage level and causing the gate terminals of P-MOS transistors 21, 22, 23, to be driven to a high voltage level. When the transistors 11, 12, 13 are subsequently turned off, there is a brief increase in voltage at the corresponding nodes. As a result, there is a brief voltage drop at the gate terminals of the transistors 21, 22, 23, biasing them into a conducting state. The corresponding nodes are thus maintained at the low potential, presenting high potentials through inverters 71, 72, 73 to decoder 10.

Each of the node potentials can be set to a high level to present a low potential to decoder 10 by cutting off the corresponding thin-film resistor. This is done by burning, or what is called "trimming" the thin-film resistors with the application of a voltage pulse to pad terminals 61, 62, 63, which are respectively connected to the junction between thin-film resistors 51, 52, 53 and N-MOS transistors 31, 32, 33. The gate terminals of these N-MOS transistors are biased at the source voltage VDD, Alternatively, the gate terminals of these N-MOS transistors may be connected respectively to corresponding nodes N1, N2, N3. Since the diffused drain region of P-MOS transistors 21, 22, 23 forms a forwardly biased p-n junction, the power-line capacitance of the source voltage VDD would be coupled to the pad terminals. As a result, a burn-out voltage pulse applied to each pad terminal has a slow rise time, resulting in a supply of insufficient energy to the corresponding thin-film resistor to burn it out. The effect of N-channel MOS transistors 31, 32, 33 is therefore to prevent the power line capacitance of the source voltage VDD from being coupled through the P-MOS transistors 21, 22, 23 to the corresponding pad terminals in order to allow burn-out voltage pulses to be applied to the pad terminals with no capacitance connected thereto so that they can reach the required voltage level within a predetermined period.

However, when the burn-out voltage is applied to each pad terminal, the impedance of the pad terminal rises sharply, and a noise pulse is generated in the burn-out voltage. If the noise pulse of a pad terminal is high, the p-n junction of the corresponding N-MOS transistor would be destroyed, causing a trimming failure.

Figure 2:
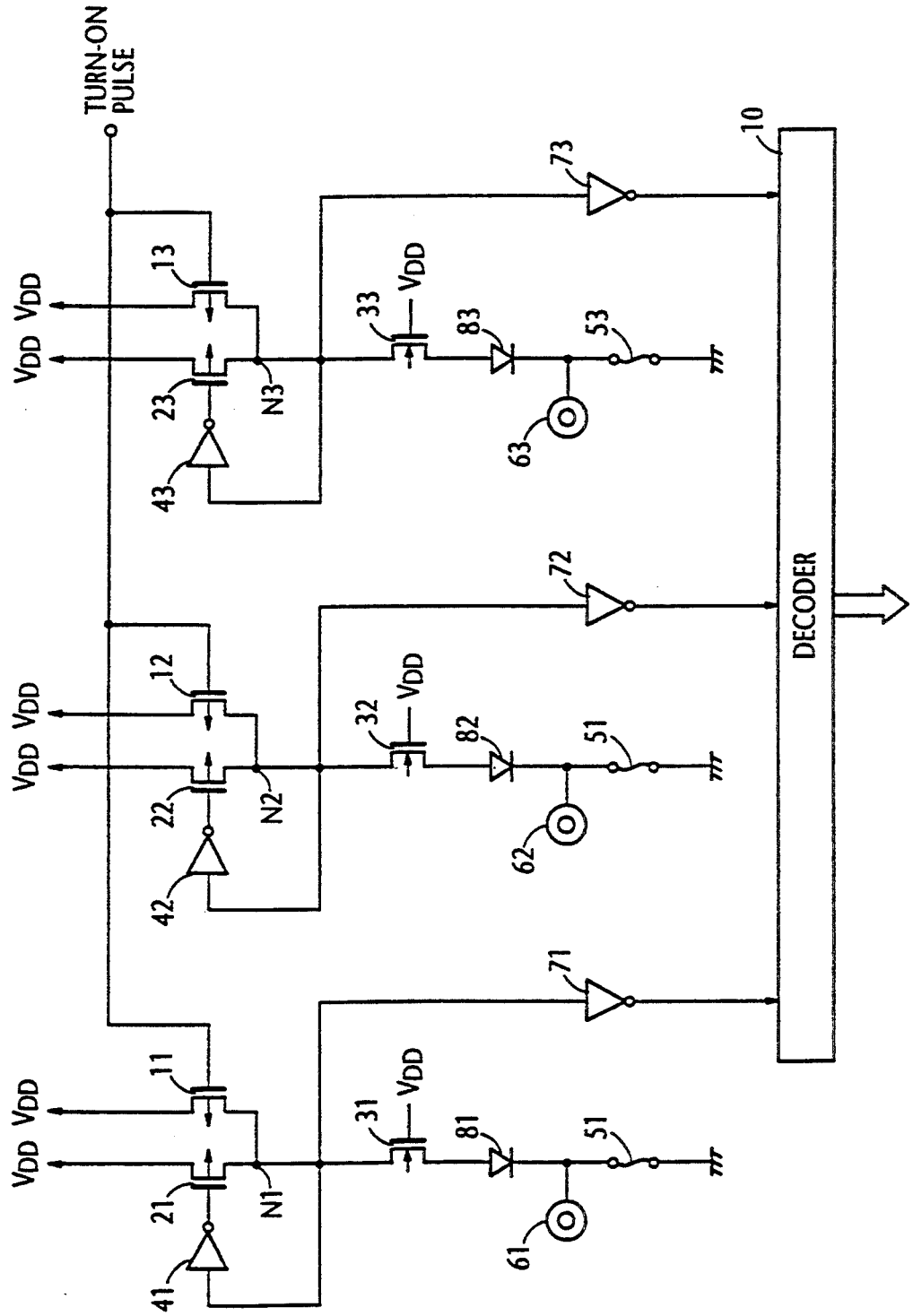
FIG. 2 is a block diagram of a first embodiment of the code setting circuit of the present invention.

As shown in FIG. 2 wherein parts corresponding to those in FIG. 1 are marked with the same numerals as those in FIG. 1, a first embodiment of the present invention solves the problem mentioned above by the provision of p-n junction diodes 81, 82, 83 between the N-MOS transistors 31, 32, 33 and the thin-film resistors 51, ,52, ,53, respectively, in such manner that currents flow in a direction from the N-MOS transistors to the corresponding thin-film resistors. The pad terminals 61, 62, 63 are respectively connected to the cathode terminals of the diodes 81, 82, 83.

According to an experiment, the application of a burn-out voltage pulse of 10 volts with 1.5-millisecond duration to one of the pad terminals 61, 62, 63 revealed that a noise voltage pulse of 23.1 volts with 100-nanosecond duration is generated. The breakdown voltage of each of the N-MOS transistors 31, 32, 33 is 19 volts. Therefore, each of the diodes 81, 82, 83 has a breakdown voltage of more than 24 volts when they are backwardly biased to prevent the noise pulse from being applied to the corresponding N-MOS transistor.

Figure 3:
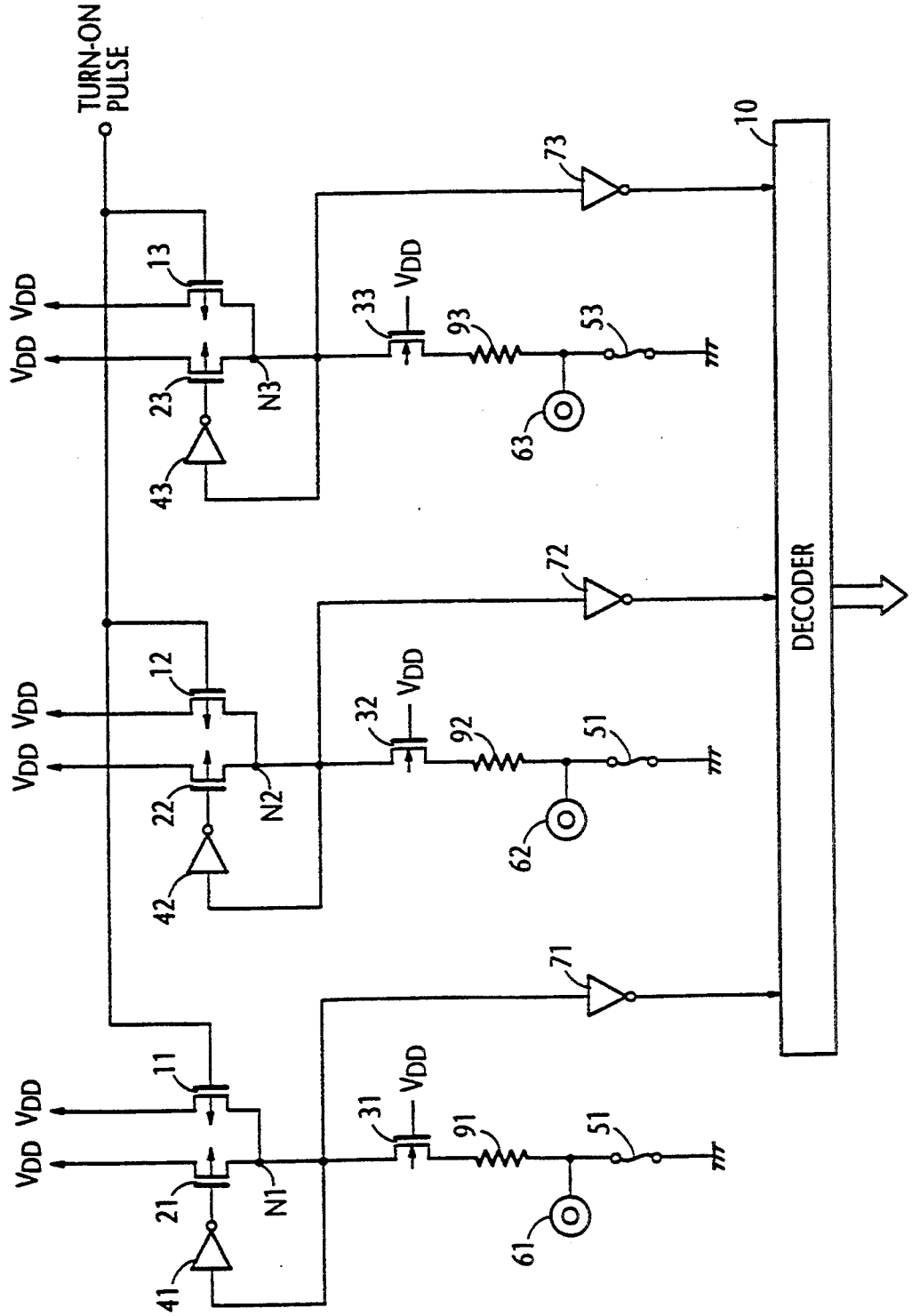
FIG. 3 is a block diagram of a second embodiment of the code setting circuit of the present invention.

Alternatively, resistors 91, 92, 93 can be used instead of the diodes 81, 82, 83, as shown in FIG. 3. The value of each of these resistors is 50 ohms which is higher than the resistance (usually 10 ohms) of the source diffusion layer of the N-MOS transistors 31, 32, 33 when an avalanche breakdown occurs. As a result, the 23-volt noise pulse generated upon the application of a burn-out voltage is divided with a ratio of 1:5 and each of the N-MOS transistors 31, 32, 33 is impressed with a voltage of about 3.8 volts that is lower than their breakdown voltage. The use of resistors 91, 92, 93 instead of diodes 81, 82, 83 is advantageous from the manufacturing point of view since they allows the use of the same materials as those used for the gate terminals of MOS transistors, such as polysilicone and polyside.

What is claimed is:

1. A code setting circuit comprising:
   a plurality of pad terminals to each of which a voltage pulse is applied;
   a plurality of thin-film resistors corresponding respectively to the pad terminals, each of said thin-film resistors being connected between the corresponding pad terminal and a reference potential;
   a plurality of first transistors of first conductivity type adapted to be rendered conductive in response to a turn-on pulse;
   a plurality of second transistors of the first conductivity type corresponding to said first transistors, each of the second transistors having a channel connected in parallel with a channel of the corresponding first transistor between a voltage source and a corresponding one of a plurality of nodes;
   a plurality of inverters corresponding respectively to the second transistors and the nodes, each of the inverters being connected between the corresponding node and the gate terminal of the corresponding second transistor;
   a plurality of third transistors of second conductivity type opposite to the first conductivity type and corresponding respectively to said nodes, each of the third transistors having a channel connected at one end to the corresponding node and a gate terminal biased so that the third transistor prevents said voltage source from being coupled through a corresponding one of the second transistors to a corresponding one of said pad terminals;
   a plurality of blocking means respectively corresponding to said third transistors and said pad terminals, each of the blocking means being connected between the other end of the channel of the corresponding third transistor and the corresponding pad terminal for preventing a noise pulse which is generated when said voltage pulse is applied to the corresponding pad terminal from being applied to the corresponding third transistor; and
   means for generating a digital signal corresponding to a set of different potentials developed at said nodes.

2. A code setting circuit as claimed in claim 1, wherein each of said blocking means comprises a diode connected so that a current flows in a direction from the corresponding third transistor to the corresponding pad terminal.

3. A code setting circuit as claimed in claim 1, wherein each of said blocking means comprises a resistor.

4. A code setting circuit as claimed in claim 3, wherein the resistance value of said resistor is greater than a resistance value which the corresponding third transistor has when an avalanche breakdown occurs therein.

* * * * *